United States Patent [19]

Iguchi et al.

[11] 4,007,358
[45] Feb. 8, 1977

[54] COUNT CONTROL SYSTEM FOR COIN COUNTING MACHINE

[75] Inventors: Masayuki Iguchi; Toshihisa Kosaka, both of Himeji, Japan

[73] Assignee: Glory Kogyo Kabushiki Kaisha, Japan

[22] Filed: Nov. 11, 1975

[21] Appl. No.: 630,887

Related U.S. Application Data

[63] Continuation of Ser. No. 455,727, March 28, 1976, abandoned.

[30] Foreign Application Priority Data

Apr. 5, 1973 Japan .............................. 48-38248
Apr. 6, 1973 Japan .............................. 48-39335

[52] U.S. Cl. .................... 235/92 CN; 235/92 ST; 235/92 R; 328/104; 133/8 R
[51] Int. Cl.² .................... G06M 3/08; G07D 9/00
[58] Field of Search ................. 235/92 CN, 92 ST; 328/104; 194/DIG. 1, 1 G; 133/8 R

[56] References Cited

UNITED STATES PATENTS

| 2,472,542 | 6/1949 | Moerman | 235/92 CN |
| 2,523,516 | 9/1950 | Potter | 235/92 CN |
| 3,803,497 | 4/1974 | Fah Mim Tyau | 328/104 |

*Primary Examiner*—Joseph M. Thesz
*Attorney, Agent, or Firm*—Wenderoth, Lind & Ponack

[57] ABSTRACT

A count system is provided with count signal generating circuits for receiving detection signals which are applied thereto at random, and a sequential drive control circuit for sequentially providing drive signals to the count signal generating circuits in synchronization with clock signals from a clock signal generator. Upon application of the detection signals, the count signal generating circuits convert the detection signals into count pulse signals which are arranged with predetermined timing.

1 Claim, 11 Drawing Figures

J-K FLIP-FLOP TRUTH TABLE

| INPUT | | | | OUTPUT | |
|---|---|---|---|---|---|
| RESET | CLOCK | J | K | Q | $\overline{Q}$ |
| L | X | X | X | L | H |
| H | ⎍ | L | L | $Q_0$ | $\overline{Q}_0$ |
| H | ⎍ | H | L | H | L |
| H | ⎍ | L | H | L | H |
| H | ⎍ | H | H | — | — |

COUNT CONTROL SYSTEM FOR COIN COUNTING MACHINE

This is a continuation of application Ser. No. 455,727 filed March 28, 1974 now abandoned.

BACKGROUND OF THE INVENTION

This invention relates to count system for counting detection signals and more particularly to a detection signal arranging circuit in the count system applicable to a coin sorting and counting machine (hereinafter referred to as a coin sorting machine).

Shown in FIG. 1 is one example of a coin sorting machine to which this invention is applicable. In this machine, a number of coins with various denominations which have been conveyed one by one by a coin conveying device 1 are mechanically sorted by a coin sorting section 2 according to the thickness and diameters, or denominations thereof, and the coins thus sorted are transferred or distributed through respective passages 4A, 4B, 4C, etc. into respective coin containers 3A, 3B, 3C, etc. which are provided separately according to the denominations. Furthermore, in the passages 4A, 4B, 4C, etc. there are provided coin detectors 5A, 5B, 5C, etc. respectively which are, for instance, microswitches. The coin detectors 5A, 5B, 5C, etc. detect coins dropping into the respective coin containers and provide detection pulse signals Sa, Sb, Sc, etc., respectively.

In this coin sorting machine, sometimes a plurality of coins may pass through the detectors 5A, 5B, 5C . . . . at the same time because the distribution of coins is carried out at random, as a result of which the total monetary values of the coins dropped into the coin containers 3A, 3B, 3C . . . . may sometimes be counted incorrectly.

In order to overcome the above-described difficulty in accompany the conventional coin sorting machine, a count system, or a count display device, as shown in FIG. 2, has been proposed.

In this count display device, the detection pulse signal Sa, Sb, Sc, etc. provided by the microswitches 5A, 5B, 5C, etc. (FIG. 1) are applied through input terminals INa, INb, INc, etc. to individual counters 1A, 1B, 1C etc., respectively, and the numbers of coins dropped into the coin containers 3A, 3B, 3C, etc. (FIG. 1) are counted by the counters 1A, 1B, 1C, etc., respectively, that is, the coins are counted separately according to the denominations of the coins, and the resulting count values are displayed on individual mechanical or electromagnetic displayers 11A, 11B, 11C, etc., respectively.

In another example of the conventional count display device, after completion of one coin sorting operation predetermined in the coin sorting machine, a total instruction ST is applied to each of the individual counters 1A, 1B, 1C . . . . so that the total numbers of coins in the coin containers are respectively read out and are applied to an addition circuit 8 in a total counter 7. In the addition circuit 8 the numbers of coins are converted into monetary values, which are added to obtain a total monetary value. This total monetary value is stored in a memory 9 and is displayed on a total monetary value displayer 10.

In such a conventional count display device as described above, however, if the coin sorting operation is suspended before one cycle of operation of the coin sorting machine has been completed, it is impossible to display the total monetary value of the coins which have been already sorted out. This is considerably very inconvenient in sorting out and counting coins according to their denomination. For instance, in order to confirm that the total monetary value is correct, it is necessry to sort out again the coins including the coins which have been sorted out already.

Furthermore, in the conventional count display device (FIG. 2), it is necessary to provide a number of individual counters 1A, 1B, 1C . . . . as great as the number of denominations of the coins to be sorted out. That is, the circuits in the conventional count display device are rather large in number.

In addition, the conventional count display device is disadvantageous for the following reason. In the conventional count display device, the total instruction ST should be applied automatically or manually to the individual counters after the completion of the coin sorting operation. In this connection, after the application of the total instruction ST, if a coin is passed through the coin detector after an unusual delay time because it has been caught between the coin conveying device 1 and the passage, the monetary value of this coin is not added into the memory 9, which leads to an erroneous count of the total monetary value. In order to overcome this, it is necessary to make the period of time necessary for sorting out coins much longer.

SUMMARY OF THE INVENTION

A primary object of this invention is accordingly to overcome the above-described difficulties accompanying conventional count systems.

Another object of the invention is to provide a novel count system in which whenever a detection pulse signal is applied thereto, an addition is carried out and the resulting value is displayed.

A further object of the invention is to provide a count system in which no error is caused in the summing of detection pulse signals even if a plurality of detection pulse signals are applied thereto at the same time.

A still further object of the invention is to provide a count system in which it is unnecessary to provide individual counters separately for the kinds of detection pulse signals applied to the count system.

A particular object of the invention is to provide a count system which has an improved and simpler construction as compared with a conventional one.

The foregoing objects and other objects as well as the characteristic features of this invention will become more apparent from the following detailed description and the appended claims when read in conjunction with the accompanying drawings, in which like parts are designated by like reference numerals or characters.

DETAILED DESCRIPTION OF THE INVENTION

One example of the count system according to this invention will be described with reference to the case where it is applied to a coin sorting machine which is capable of sorting out, for instance, five kinds of coins: 100-yen, 50-yen, 10-yen, 5-yen and 1-yen coins.

Figure 3A:
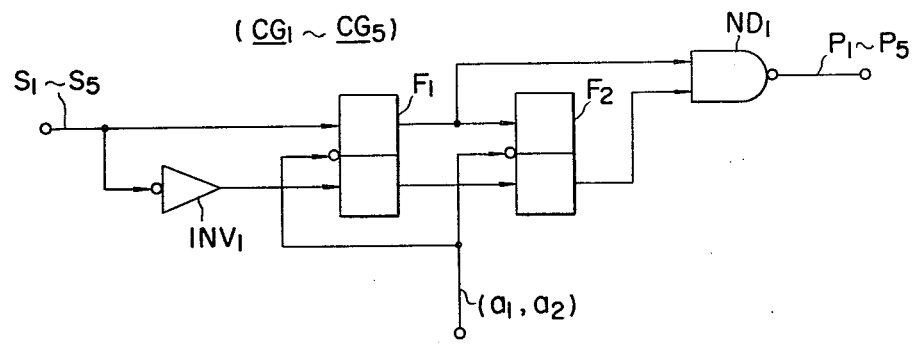
FIG. 3A is a schematic block diagram illustrating a count signal generating circuit in the count system in FIG. 3.
Figure 3:
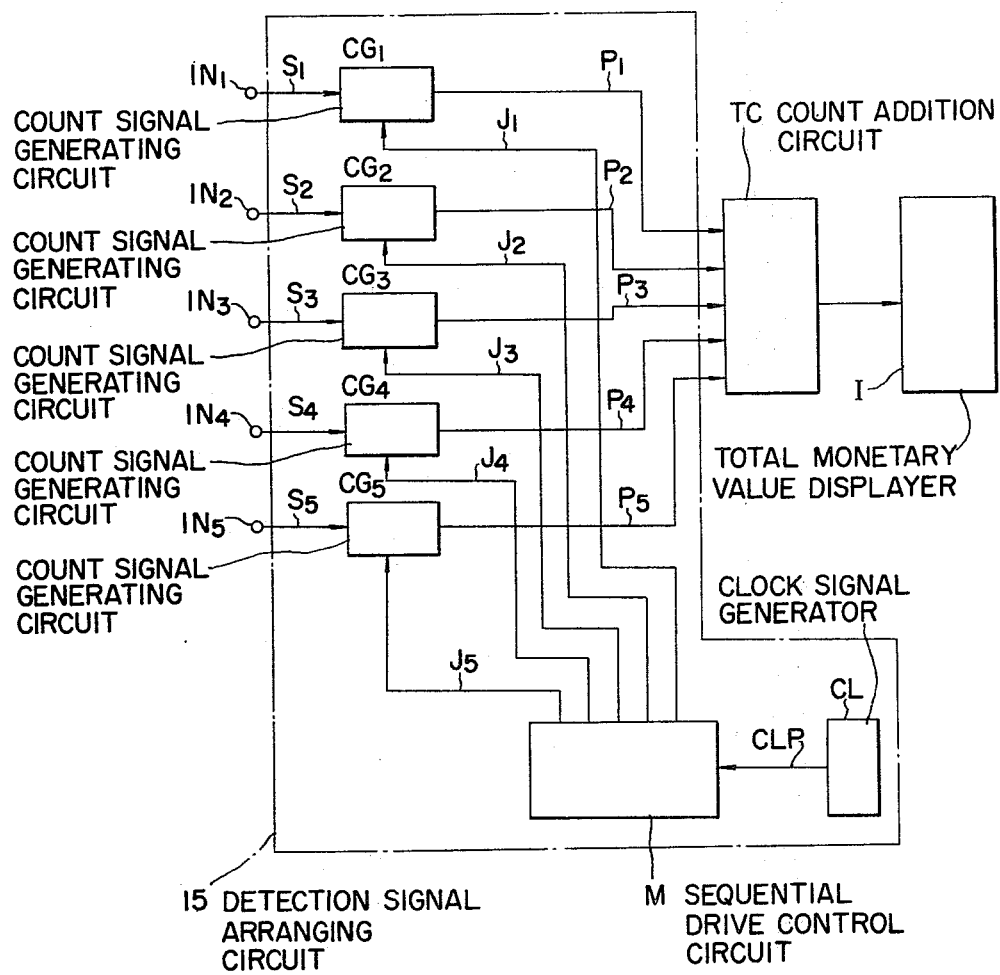
FIG. 3 is a schematic block diagram illustrating one example of a count system according to this invention.

This count system, as is shown in FIG. 3, comprises a detection signal arranging circuit 15, a count addition circuit TC, and a total monetary value displayer. The detection signal arranging circuit 15 comprises count signal generating circuits $CG_1$ $CG_2$, $CG_3$, $CG_4$ and $CG_5$ which are provided separately according to the denomination of coins, 100-yen, 50-yen, 10-yen, 5-yen and 1-yen.

Coin detection pulse signals $S_1$, $S_2$, $S_3$, $S_4$ and $S_5$ are provided when 100-yen through 1-yen coins are detected, respectively. The detection pulse signals $S_1$ through $S_5$ thus provided are applied to respective count signal generating circuits $CG_1$, $CG_2$, $CG_3$, $CG_4$ and $CG_5$ through input terminals $IN_1$, $IN_2$, $IN_3$, $IN_4$ and $IN_5$, respectively. More specifically, when a 100-yen coin is detected in the coin sorting machine, the detection pulse signal $S_1$ is applied through the input terminal $IN_1$ to the count signal generating circuit $CG_1$; when a 50-yen coin is detected, the signal $S_2$ is applied through the input terminal $IN_2$ to the count signal generating circuit $CG_2$; and so forth.

Sequential drive signals $J_1$, $J_2$, $J_3$, $J_4$ and $J_5$ are sequentially generated by a sequential drive control circuit M in synchronization with clock signals CLP from a clock signal generator CL and are applied to the count signal generating circuits $CG_1$ through $CG_5$, respectively. When, under these conditions, the detection pulse signals $S_1$ through $S_5$ are applied to the count signal generating circuits $CG_1$ through $CG_5$, count signals are provided by the count signal generating circuits, respectively. More, specifically, under the condition that for instance the sequential drive signal $J_1$ is applied to the count signal generating circuit $CG_1$ when the detection signal $S_1$ is applied to the same $CG_1$, one count signal is provided by the circuit $CG_1$. The count signals thus provided are arranged according to this invention as will become apparent from the following description. In this connection, a high voltage level and a low voltage level of a signal will hereinafter be referred to as an "H" level or a high level, and an "L" level or a low level, respectively, when applicable.

A typical circuit diagram of the count signal generating circuit CG is shown in FIG. 3A, which comprises J-K flip-flop circuits $F_1$ and $F_2$ which are connected in cascade. When the first clock pulse $a_1$ is applied to a clock terminal of the front stage flip-flop circuit $F_1$ with a detection pulse signal of a high level being applied to the flip-flop circuit $F_1$, the flip-flop circuit $F_1$ changes its state to introduce its outputs (an output Q at a high level, and an output $\overline{Q}$ at a low level) to the rear stage flip-flop circuit $F_2$. When under this condition, the second clock pulse $a_2$ is applied to the clock terminal of the flip-flop circuit $F_2$, the flip-flop circuit $F_2$ changes its state.

Thus, based on the fact that the output Q of the flip-flop circuit $F_1$ is at a high level while the output $\overline{Q}$ of the flip-flop circuit $F_2$ is also at a high level for the period when the first clock pulse $a_1$ and the second clock pulse $a_2$ are applied thereto, a low level count pulse having a duration equal to the pulse interval of the clock pulses $a_1$ and $a_2$ is provided by an output NAND circuit $ND_1$ which receives the output Q of the flip-flop circuit $F_1$ and the output $\overline{Q}$ of the flip-flop circuit $F_2$. The count signal generating circuit further comprises an inverter $INV_1$.

In this embodiment (FIG. 3), the control circuit M provides two clock pulses at a time from the clock signal generator CL. The clock pulses thus provided are the clock pulses applied to the flipflop circuits $F_1$ and $F_2$ described above. These clock pulses are applied, as the sequential drive signals $J_1$ through $J_5$, to the count signal generating circuits $CG_1$ through $CG_5$.

Thus, upon application of the detection pulse signals $S_1$ through $S_5$, the count signals $P_1$ through $P_5$ are sequentially provided by the count signal generating circuits $CG_1$ through $CG_5$ with a lapse of time therebetween and are applied to the count addition circuit TC. That is, the count signals $P_1$ through $P_5$ are sequentially applied to the addition circuit TC. whenever a count signal is applied to the addition circuit TC, this count signal is converted into a binary coded decimal number corresponding to the denomination of the coin to which the count signal is related, and the binary coded decimal numbers thus obtained are summed up and stored in the addition circuit TC.

The contents stored in the addition circuit TC are displayed in decimal numbers on the total monetary value displayer I which is composed of, for instance, fluorescent display tubes or Nixie tubes.

As is apparent from the above description, according to this invention, whenever a detection pulse signal is applied to the count system, a total monetary value is displayed. Accordingly, even if the operation of the coin sorting machine is discontinued at any moment, the total monetary value of the coins which have been already sorted out can be correctly displayed, which leads to the economical use of the coin sorting machine and to the simplification of the coin sorting work.

The count signal generating circuits $CG_1$ through $CG_5$, as described above with reference to FIG. 3, are provided for the detection pulse signals $S_1$ through $S_5$, respectively, and are sequentially driven thereby to sequentially provide the count signals $P_1$ through $P_5$ with the lapse of time therebetween. Accordingly, even if a plurality of detection pulse signals occur at the same time, no error is caused in the display of a total monetary value. In addition, the count addition circuit can be made simple in construction.

The count signal generating circuits $CG_1$ through $CG_5$ shown in FIG. 3A are not limited thereto and may be of, for instance, a monostable circuit type.

The count system of this invention will be described in more detail. As is shown in FIG. 3, the count signal arranging circuit 15 is provided in the paths of the detection pulse signals $S_1$ through $S_5$ to the count addition circuit TC, for providing the count signals $P_1$ through $P_5$ sequentially at predetermined times which correspond to the detection pulse signals $S_1$ through $S_5$, respectively.

The count signal arranging circuit 15 comprises: the count signal generating circuits $CG_1$ through $CG_5$ provided respectively in the paths of the detection pulse signals $S_1$ through $S_5$; and the sequential drive control circuit M for providing the sequential drive signals $J_1$ through $J_5$ to the count signal generating circuits $CG_1$ through $CG_5$ in synchronization with the clock signals CLP from the clock signal generator CL, as was described above.

Figure 4:
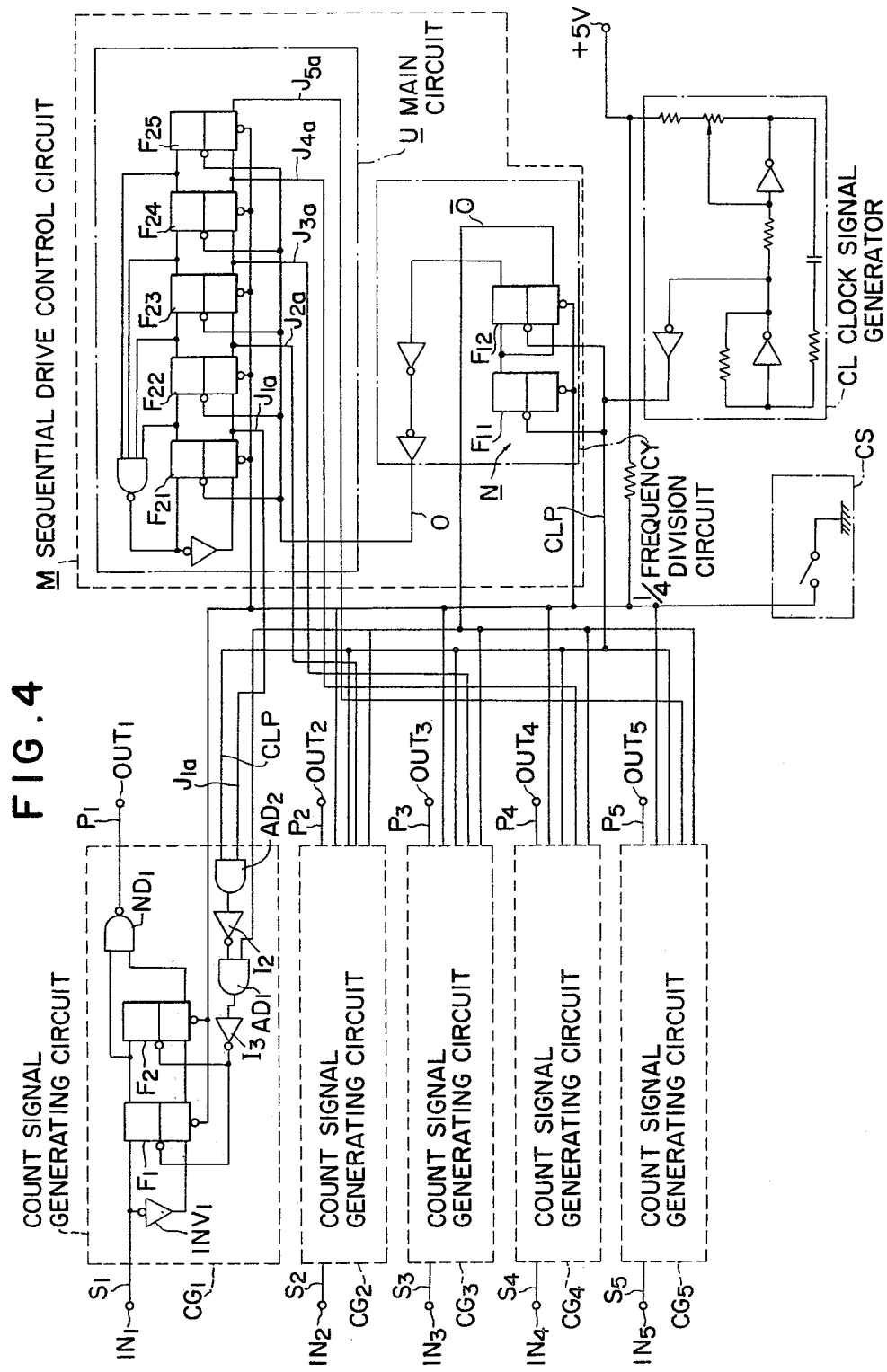
FIG. 4 is a schematic circuit diagram illustrating more concretely the count system shown in FIG. 3.
Figure 5:
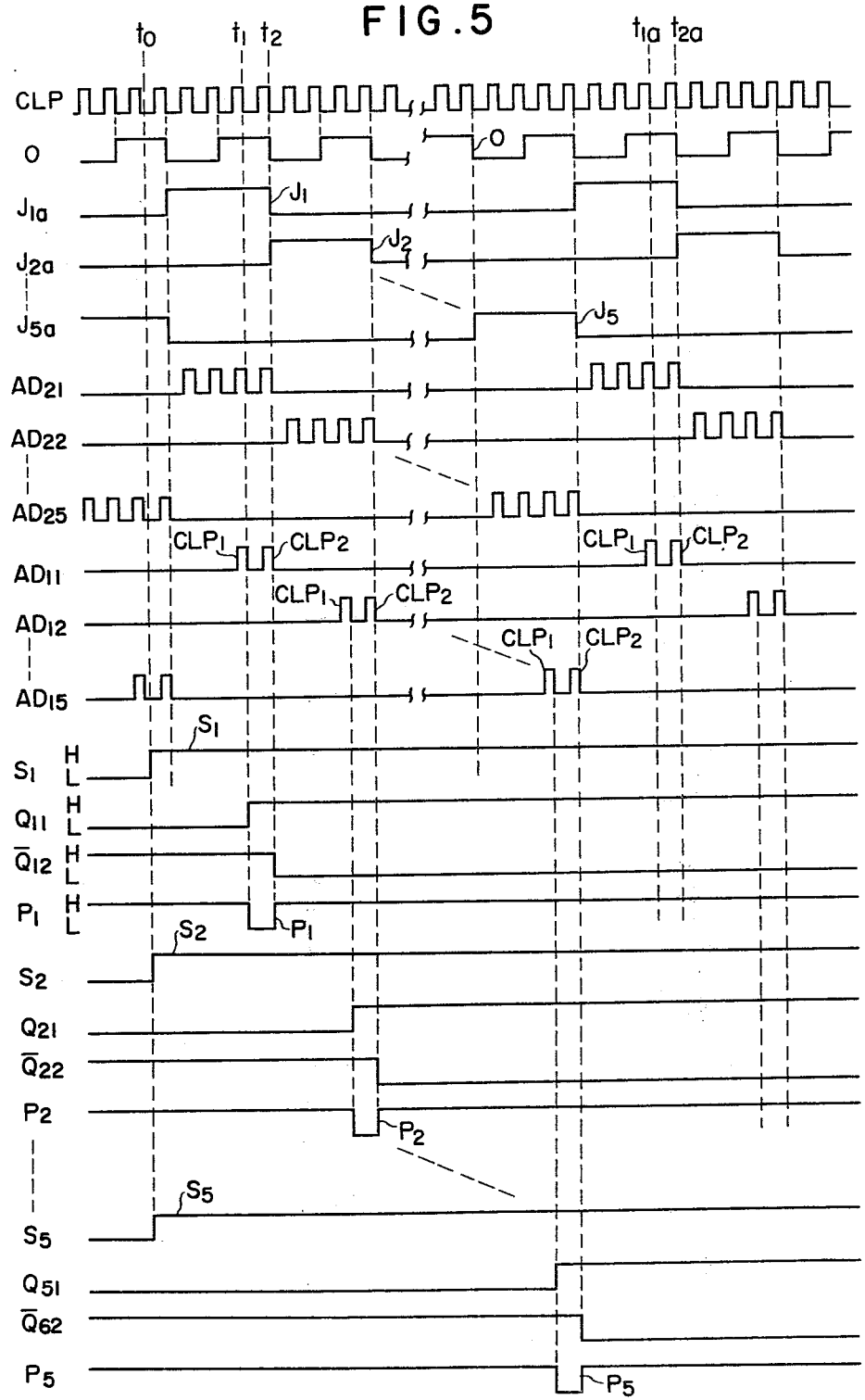
FIG. 5 is a graphical representation of various signals employed in the count system shown in FIG. 4.

One example of this count signal arranging circuit 15 will be described with reference to FIG. 4. A clock signal generator CL shown in FIG. 4 is of a nonstable multivibrator type and produces square wave clock pulses CLP which are applied to a one-fourth frequency division circuit N composed by of flip-flop circuits $F_{11}$ and $F_{12}$. An output "O", or a 1/4 frequency division output "O", of the frequency division circuit N is applied, as a clock pulse, to flip-flop circuits $F_{21}$, $F_{22}$, $F_{23}$, $F_{24}$ and $F_{25}$ which form a main circuit U in the sequential drive control circuit M. As a result, the drive signals $J_{1a}$ through $J_{5a}$ each having a duration euqal to four periods of the clock pulse CLP, as is indicated by reference symbols $J_{1a}$ through $J_{5a}$ in FIG. 5, are produced at the output terminals Q of the flip-flop circuits $F_{21}$ through $F_{25}$.

Since all of the count signal generating circuits $CG_1$ through $CG_5$ are the same in construction, the construction of the circuit $CG_1$ will be described in more detail as representative of the count signal generating circuits $CG_1$ through $CG_5$. The count signal generating circuit $CG_1$ comprises two flip-flop circuits $F_1$ and $F_2$ connected in cascade. The detection pulse signal $S_1$ is applied directly to one input terminal of the flip-flop circuit $F_1$ and is applied through an inverter $INV_1$ to the other input terminal of the circuit $F_1$. On the other hand, the output Q of the front stage flipflop circuit $F_1$ and the output $\overline{Q}$ of the rear stage flip-flop $F_2$ are both applied to an output NAND circuit $ND_1$ from which the count signal $P_1$ is produced.

In the path of a clock pulse to the flip-flop circuits $F_1$ and $F_2$, there is provided a clock pulse gate circuit comprising AND gates $AD_1$ and $AD_2$. The clock pulse output CLP from the clock signal generator CL and the drive signal $J_{1a}$ are applied to the AND gate $AD_2$, as a result of which four clock pulses as shown by $AD_{21}$ in FIG. 5 are provided through the AND gate $AD_2$. These four clock pulses are applied through an inverter $I_2$ to one input terminal of the AND gate $AD_2$, while the output $\overline{Q}$ or $\overline{O}$ (which is a reverse signal of 0), of the rear stage flip-flop circuit $F_{12}$ is applied to the other input terminal of the AND gate $AD_1$. Accordingly, out of the four clock pulses, the third clock pulse $CLP_1$ and the fourth clock pulse $CLP_2$, as shown by $AD_{11}$ in FIG. 5, are provided through the AND gate $AD_1$. The third and fourth clock pulses $CLP_1$ and $CLP_2$ are applied through an inverter $I_3$ to the clock terminals of the flip-flop circuits $F_1$ and $F_2$.

The other count signal generating circuits $CG_2$, $CG_3$, $CG_4$ and $CG_5$ are the same in construction as that of the count signal generating circuit $CG_1$ described above. Singnals related to these circuits $CG_2$, $CG_3$, $CG_4$ and $CG_5$ are suffixed with numerals 2, 3, 4 and 5, respectively, in FIG. 5.

As is apparent from the above description, whenever the sequential drive signal $J_{1a}$ $J_{2a}$ $J_{3a}$ $J_{4a}$ $J_{5a}$ is obtained in the order stated, pairs of clock pulses $CLP_1$ and $CLP_2$ are applied to the count signal generating circuits $CG_1$ through $CG_5$ in shychronization with the clock pulse signal CLP. Reference character CS designates a clear switch in FIG. 4.

When the detection pulse signal $S_1$ has not been applied to the count signal generating circuit $CG_1$ yet and the input terminal $IN_1$ of the count signal generating circuit $CG_1$ is at a low level before the time instant $t_o$ as is shown by $S_1$ in FIG. 5, a first input terminal of the flip-flop circuit $F_1$ is at a high level while a second input terminal thereof is at a low level. Under these conditions, the output Q of the flip-flop circuit $F_1$ is at a low level (FIG. 5, $Q_{11}$), while the output $\overline{Q}$ of the flip-flop circuit $F_2$ is at a high level (FIG. 5, $\overline{Q}_{12}$). Accordingly, the output terminal $OUT_1$ of the NAND circuit $ND_1$ is at a high level (FIG. 5, $P_1$).

Then, upon application of the detection pulse signal $S_1$ to the count signal generating circuit $CG_1$ at the time instant $t_o$, the levels at the first and second input terminals of the flip-flop circuit $F_1$ become a high level and a low level, respectively. This state is written in the flip-flop circuit $F_1$ with the aid of the trailing edge of the first clock pulse $CLP_1$ of two clock pulses which are supplied to the flip-flop circuit $F_1$ by the clock pulse gate circuit, whereby the output Q of the circuit $F_1$ is maintained at a high level after the time instant $t_1$. Accordingly, the outputs Q and $\overline{Q}$ of the flip-flop circuit $F_1$, which are at a high level and at a low level respectively, are applied to the first input terminal and the second input terminal of the flip-flop circuit $F_2$, respectively. This state is written in the circuit $F_2$ upon application of the second pulse $CLP_2$ at the time instant $t_2$, and the level of the output $\overline{Q}$ of the circuit $F_2$ is changed from the high level to a low level.

Accordingly, the output of the NAND circuit $ND_1$ has a low level for the period from the time instant $t_1$ to the time instant $t_2$. This output is introduced, as the count signal $P_1$, to the output terminal $OUT_1$.

It should be noted that the oscillation frequency of the clock signal generator CL is selected in advance so that its oscillation period is much shorter than the duration of the detection pulse signal. For this reason, the drive signal $J_{1a}$ is applied repeatedly at a predetermined period to the count signal generating circuit $CG_1$ for the period when the detection pulse signal $S_1$ is applied to the circuit $CG_1$. In response to this, a pair of clock pulses $CLP_1$ and $CLP_2$ are repeatedly applied to the second signal generating circuit $CG_1$ after the time instant $t_2$ also. However, if the states of the flipflop circuits $F_1$ and $F_2$ are changed into the states which were described above at the time instants $t_1$ and $t_2$, the states thus changed will not be changed again even if the pulses $CLP_1$ and $CLP_2$ of the succeeding period are applied at the time instants $t_{1a}$ and $t_{2a}$ (FIG. 5). In consequence, the count signal $P_1$ provided to the output terminal $OUT_1$ of the count signal generating circuit $CG_1$, is the only one which is obtained with the aid of two pulses $CLP_1$ and $CLP_2$ which first change the states of the flip-flop circuits $F_1$ and $F_2$.

The same operations as described above are performed in the other count signal generating circuits $CG_2$ through $CG_5$.

The case when, in FIG. 5, the detection pulse signal $S_1$ is applied to the count signal generating circuit $CG_1$ at the time instant $t_o$, and at the same time instant (as the time instant $t_o$) the other detection pulse signals $S_2$ through $S_5$ are also applied to the respective count signal generating circuits will be described. In this case, after the count signal $P_1$ corresponding to the detection pulse signal $S_1$ has been provided by the count signal generating circuit $CG_1$, the count signals $P_2$ through $P_5$ corresponding respectively to the detection pulse signals $S_2$ through $S_5$ are sequentially provided by the respective count signal generating circuits $CG_2$ through $CG_5$ whenever the pulses $CLP_1$ and $CLP_2$ occuring within the periods of duration of the drive signals $J_2$ through $J_5$ are applied to the count signal generating circuits $CG_2$ through $CG_5$, respectively.

Figure 1:
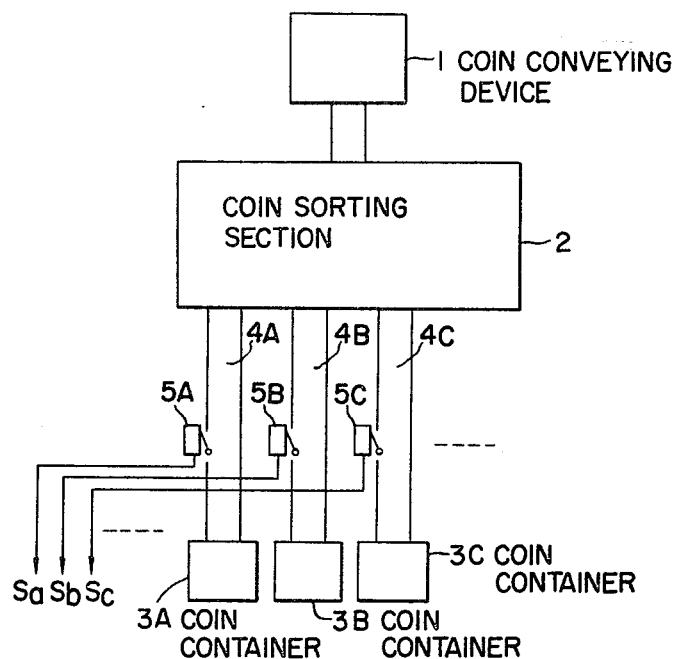
FIG. 1 is a schematic block diagram illustrating a coin sorting machine to which this invention can be applied.
Figure 2:
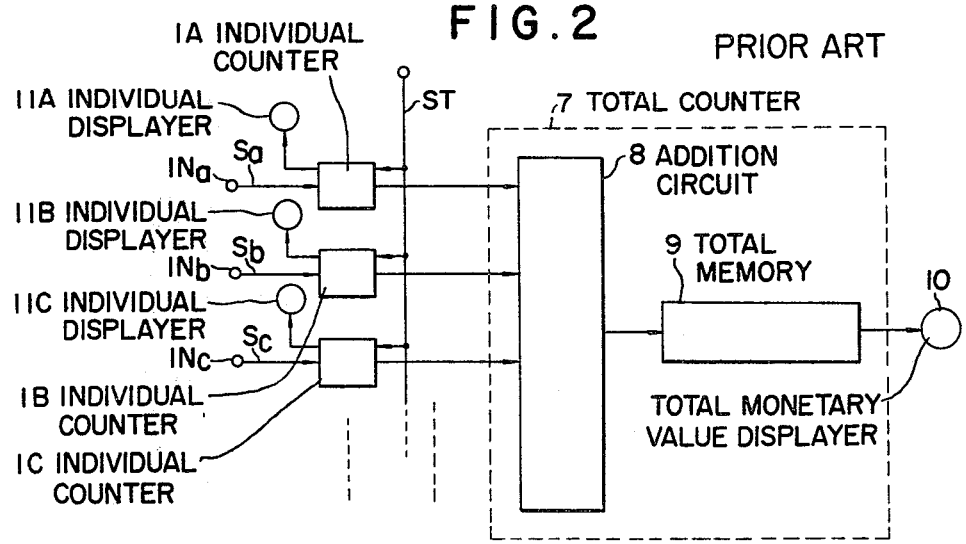
FIG. 2 is a schematic block diagram showing a conventional count display device.

Thus, in this invention, it is possible to positively provide the arranged count signals corresponding to the detection pulse signals whenever the latter are applied to the count signal generating circuits. Furthermore, even if a plurality of detection pulse signals are applied simultaneously to the count system, or to the count signal generating circuits, these detection pulse signals are converted into count signals which are arranged sequentially at predetermined time intervals. Therefore, a count error which is caused by simultaneously applying detection pulse signals can be positively eliminated. In this connection, the arranged count signals which have a pulse length predetermined by the clock pulse interval can be obtained regardless of the durations of the detection pulse signals and in response to the application of the detection pulse signals. Accordingly, if this invention is applied to a count addition circuit as shown in FIG. 2, it is possible to apply the count signals directly to a memory register, which leads to the elimination of the individual counters and to the simplification of the total counter.

In the above description, the count signals are provided in a parallel mode; however, they may be provided through, for instance, an output OR circuit in a series mode.

While this invention has been described in connection with the case where it is applied to a coin sorting machine, it is to be clearly understood that this description is made only by way of example and this invention can be applied to any case where a plurality of detection pulse signals are summed up.

Figures 6, 7A:
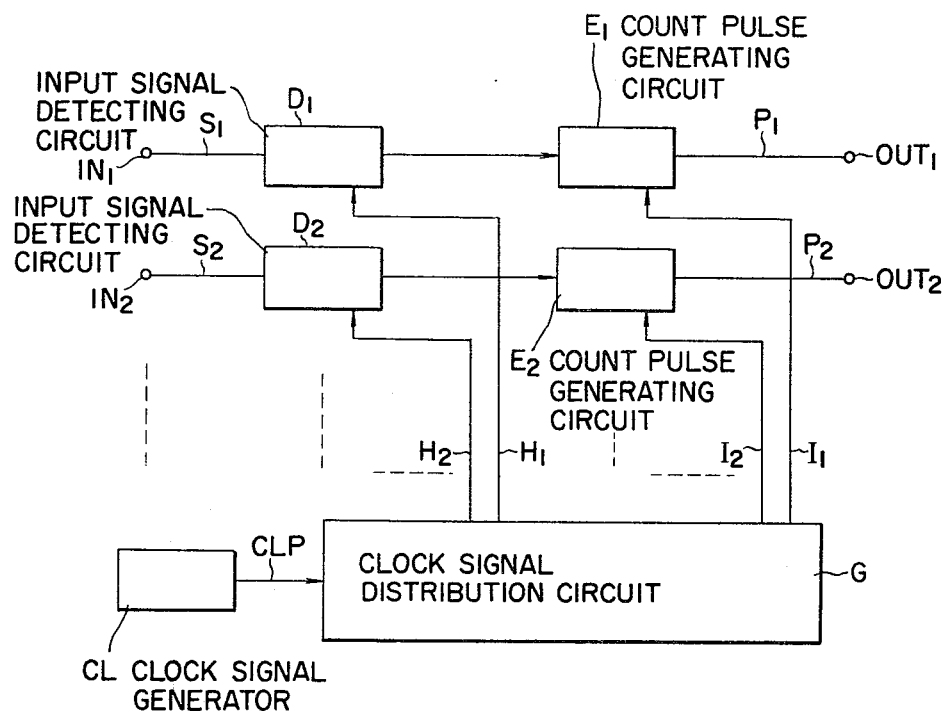
FIG. 6 is a block diagram illustrating another example of the count system according to this invention.
FIG. 7A is a truth table for describing the operation of a J-K flip-flop circuit in FIG. 7.

Another example of the detection signal arranging circuit according to this invention is shown in FIG. 6. This example will be described with reference to the case where it is applied to a coin sorting machine.

The detection signal arranging circuit comprises: input signal detecting circuits $D_1$, $D_2$, .... which detect and store detection pulse signals $S_1$, $S_2$, ...., respectively; and count pulse generating circuits $E_1$, $E_2$, .... which are provided at the rear stages of the input pulse detecting circuits $D_1$, $D_2$, ...., for reading out the contents stored therein with predetermined timing to generate count pulse signals $P_1$, $P_2$ .... having a predetermined pulse length and arranged sequentially. These circuits $D_1$, $D_2$, .... and $E_1$, $E_2$, .... are sequentially driven with the aid of driving clock $H_1$, $I_1$, $H_2$, $I_2$, ...., respectively, which are sequentially provided by a clock signal distribution gate circuit G in correspondence to clock pulses CLP from a clock signal generator CL.

Figure 7:
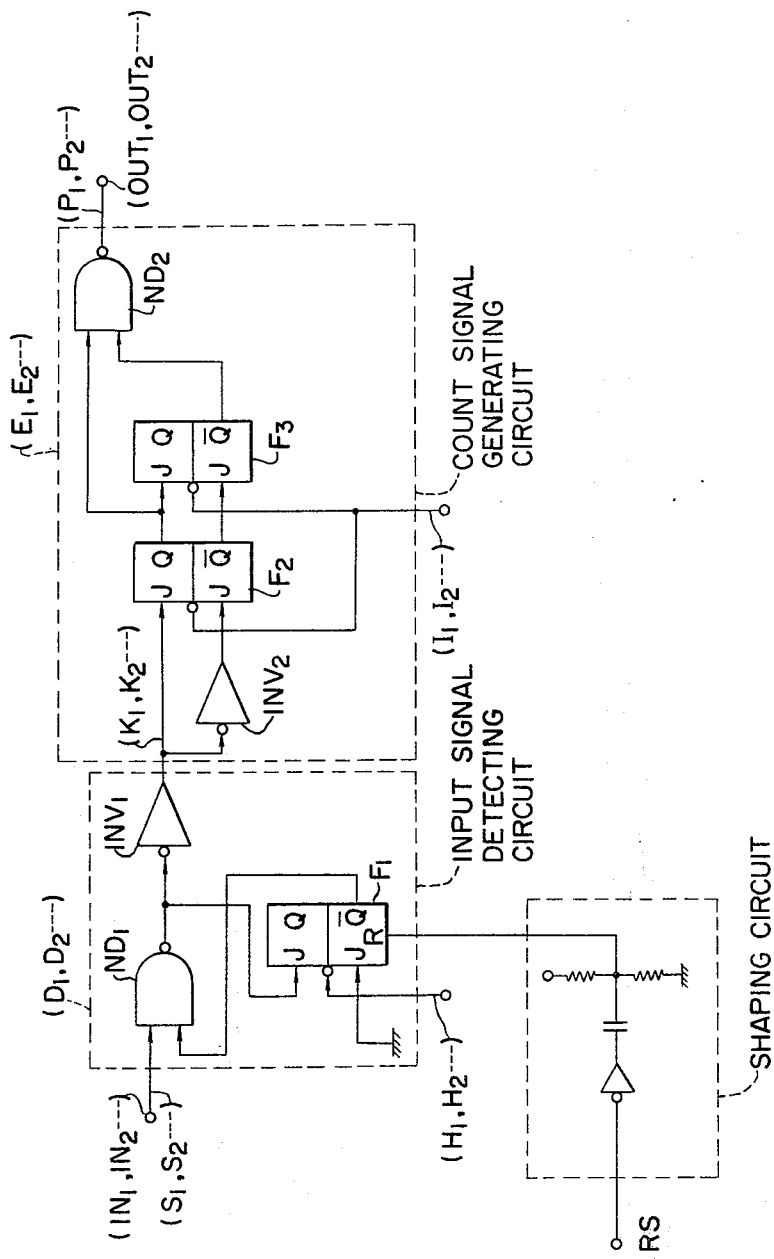
FIG. 7 is a schematic block diagram illustrating an input signal detecting circuit and a count signal generating circuit in the count system shown in FIG. 6.

The input signal detecting circuits $D_1$, $D_2$, .... have the same construction. Therefore, only the input signal detecting circuit $D_1$ will be described. This circuit $D_1$, is illustrated in FIG. 7, is provided with a logical product circuit, for instance, a NAND circuit $ND_1$ receiving an input signal $S_1$ through its one input terminal $IN_1$, and for instance a J-K flip-flop circuit $F_1$ receiving a driving clock signal $H_1$ through its clock terminal.

An output $\overline{Q}$ of the flip-flop circuit $F_1$ is applied to the other input terminal of the NAND circuit $ND_1$. An output from the NAND circuit $ND_1$ is provided, as an input detection signal $K_1$, through an inverter $INV_1$ to the input J of the flip-flop circuit $F_1$. A reset signal RS is applied to the reset terminal R of the circuit $F_1$. An input terminal K of the flip-flop circuit $F_1$ is grounded.

The count signal generating circuits $E_1$, $E_2$, .... are also the same in construction. As a representative of the circuits $E_1$, $E_2$, ...., the count signal generating circuit $E_1$ will be described with reference to FIG. 7. This circuit $E_1$ is provided with two J-K flipflop circuits $F_2$ and $F_3$ connected in cascade. The input detection signal $K_1$ is applied directly to the input terminal J of the flipflop circuit $F_2$ and is applied through an inverter $INV_2$ to the input terminal K of the same. On the other hand, the driving clock signal $I_1$ is applied to the clock terminals of the flip-flop circuits $F_2$ and $F_3$. The output Q of the flip-flop $F_2$ is applied to an output NAND circuit $ND_2$, which provides a logical product output, that is, the count pulse signal $P_1$, through its output terminal $OUT_1$.

In this example (FIG. 6), the clock signal distribution gate circuit G introduces a pulse train consisting of four clock pulses CLP from the clock signal CL at a time, and sequentially allots the pulse train thus introduced to the circuits $D_1$ and $E_1$, $D_2$ and $E_2$, .... corresponding to the input signals $S_1$, $S_2$, ..... The first and second pulses $a_1$ and $a_2$ of the pulse train are distributed, as the driving clock signal $H_1(H_2, H_3, .....)$, to the circuit $D_1$ ($D_2$, $D_3$, .....) (FIG. 8, $H_1$ ($H_2$, $H_3$, ....)), while the third and fourth pulses $a_3$ and $a_4$ of the pulse train are distributed, as the driving clock signal $I_1$ ($I_2$, $I_3$, .....), to the circuit $E_1$ ($E_2$, $E_3$, ....) (FIG. 8, $I_1$ ($I_2$, $I_3$, .... )).

In the circuit shown in FIG. 7, when for instance the input signal $S_1$ is applied to the input signal detecting circuit $D_1$ at the time instant $t_o$ (FIG. 8) and thereafter the driving clock signal clock signal $H_1$ is applied to the input signal detecting circuit $D_1$ at the time instants $t_1$ and $t_2$ (FIG. 8), the state of the J-K flip-flop circuit $F_1$ is not changed because the output signal of the NAND circuit $ND_1$ is at a low level and accordingly the input J and the input K thereof are both at a low level. Thereafter, the second clock signal $H_2$ is applied to the input signal detecting circuit $D_2$. In this case also, the J-K flip-flop circuit $F_1$ does not change its state and provides a high level signal at the output terminal $\overline{Q}$.

On the other hand, in the case where the input signal $S_1$ is not applied at the time when the clock signal $H_1$ is applied, the output signal of the NAND circuit $ND_1$ is at a high level and therefore the J-K flip-flop circuit $F_1$ changes its state, thereby providing a low level signal at the terminal $\overline{Q}$. This state is maintained until the reset signal has been applied to the reset terminal R of the J-K flip-flop circuit $F_1$. Thus, an erroneous operation (described later) caused by the arrival of the input signal at the time instants $t_3$ and $t_4$ can be prevented by the state change of the flip-flop circuit $F_1$.

Under the conditions that the J-K flip-flop circuit $F_1$ has changed its state, that is, the low level signal is provided at the output terminal $\overline{Q}$, the input signal is locked by the NAND circuit $ND_1$. Therefore, during this period even if the level of the input signal $S_1$ becomes a high level, this input signal $S_1$ is locked until the J-K flip-flop circuit $F_1$ has been reset by the reset signal.

Figure 8:
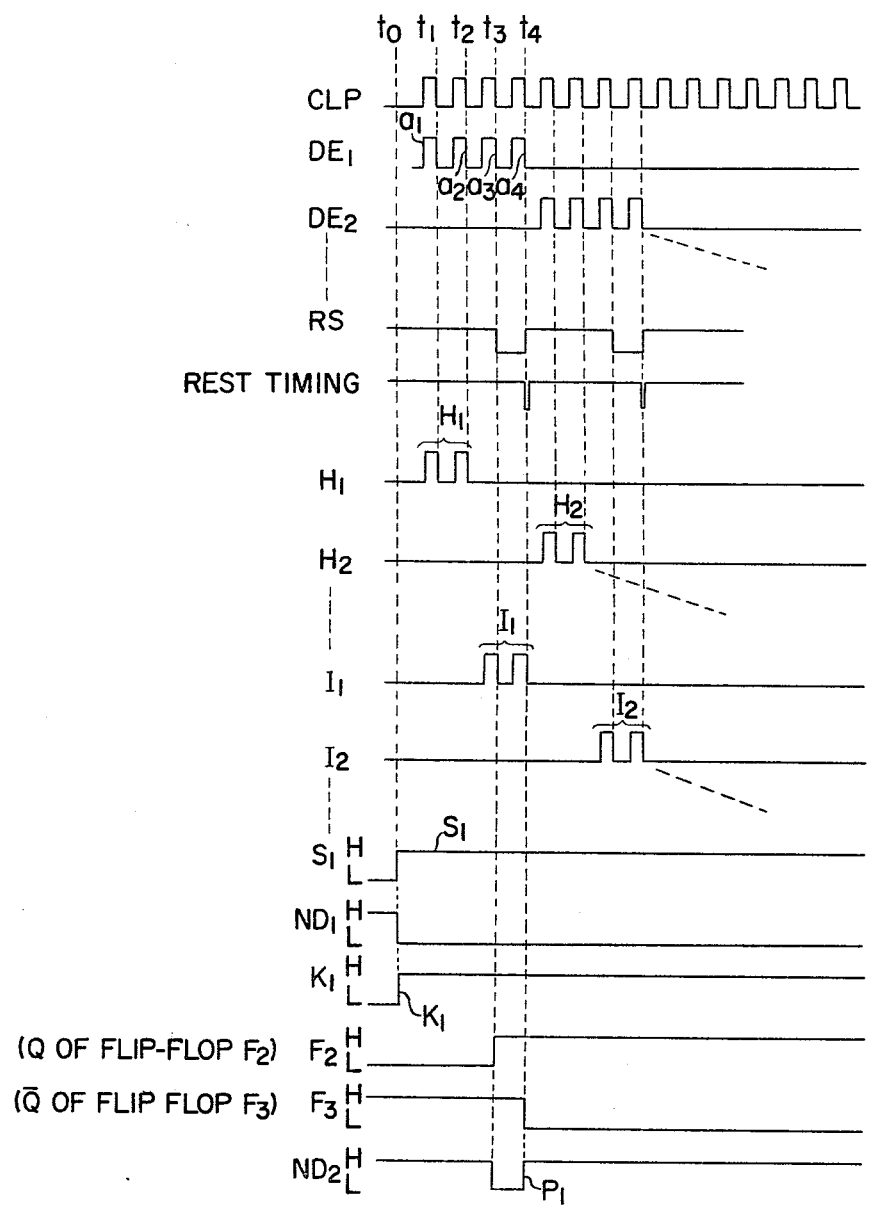
FIG. 8 is a graphical representation of various signals employed in the count system shown in FIG. 6.

Next, the case where the input signal $S_1$ is applied before the time instant $t_1$ will be described. In this case, the state of the J-K flip-flop circuit $F_1$ is not changed by the application of the clock pulses $a_1$ and $a_2$, and a low level signal is provided by the NAND circuit $ND_1$ and is applied, as a high level detection signal $K_1$ (FIG. 8, $K_1$), through the inverter $INV_1$ to the flip-flop circuit $F_2$ in the count signal generating circuit $E_1$. Thereafter, when the third clock pulse $a_3$ is applied to the count signal generating circuit $E_1$ at the time instant $t_3$, the state of the flip-flop circuit $F_2$ is changed by the high level detection signal $K_1$ and therefore the level of the output Q thereof becomes a high level (FIG. 8, $F_2$). At this time, the flip-flop circuit $F_3$ is in a reset state and the output Q thereof is at the high level (FIG. 8, $F_3$). Accordingly, the level of the output of the NAND circuit $ND_2$ is changed to a low level at the time instant $t_3$ (FIG. 8, $ND_2$). Thereafter, when the eighth clock pulse $a_4$ is applied to the count pulse generating circuit $E_1$ at the time instant $t_4$, the state of the circuit $F_3$ is changed by the output of the circuit $F_2$ whose state has been changed, and therefore the level of the output $\overline{Q}$ of the circuit $F_3$ becomes a low level. Accordingly, the level of the output of the NAND circuit $ND_2$ is changed to the high level at the time instant $t_4$. Thus, a low level count pulse signal $P_1$ having a duration equal to the period between the time instants $t_3$ and $t_4$ is provided at the output terminal $OUT_1$ of the count signal generating circuit $E_1$.

The operations of the circuits $D_2$ and $E_2$, $D_3$ and $E_3$, . . . . to which the input signals $S_2$, $S_3$, . . . . are applied are the same as described above.

The oscillation frequency of the clock signal generator CL is selected in advance so that its period is much shorter than the duration of the input signal. In addition, the driving pulse signals $H_1$ and $I_1$, $H_2$ and $I_2$, and so forth of the clock signal distribution gate circuit G are generated repeatedly in the order stated. Thus, when the input signals $S_1$, $S_2$, and so forth are introduced at the same time, the detections of these input signals and the generation of the count pulses $P_1$, $P_2$, . . . . are carried out sequentially with a lapse of time therebetween.

The second pulse $a_2$ is employed for backing up the operation of the first pulse $a_1$. That is, if the introduction of the input signal cannot be detected by the first pulse $a_1$, it is detected by the second pulse $a_2$. However, from the theoretical view point the second pulse $a_2$ may be omitted.

As is apparent from the above description, according to this invention, the input signals are detected and stored only by the detecting circuit which carries out the detection and storage operation only by the clock pulses having the predetermined period, which leads to the stable detection of the input signals. Furthermore, the input signal thus detected can be read out with proper timing. Accordingly, if the count signal generating circuits are provided at the rear stages of the detecting circuits as described above, so that, even if a plurality of input signals are applied at the same time, these input signals are converted into count pulse signals which are arranged sequentially and have an optional duration (corresponding to a clock pulse interval), the construction of the addition circuit for summing up the pulses arranged sequentially can be considerably simplified.

Figure 9:
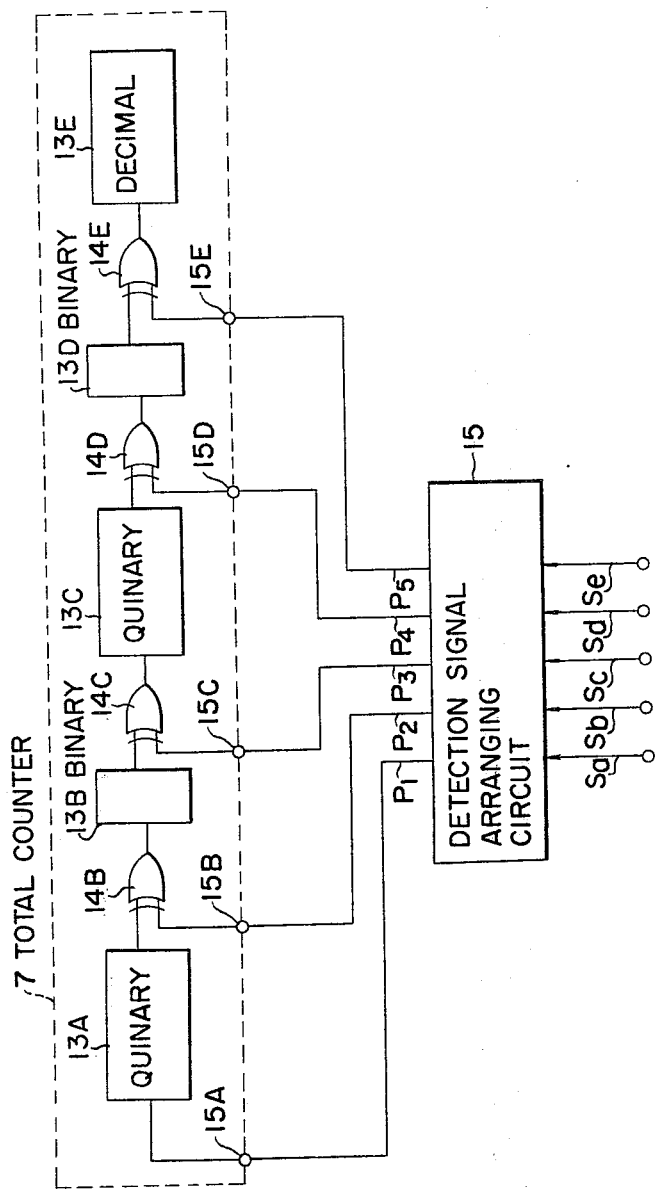
FIG. 9 is a block diagram showing another example of the count system according to this invention.

Shown in FIG. 9 is another embodiment of the count system according to this invention. This count system, or a count addition circuit, will be described with reference to the case where it is applied to a coin sorting machine which operates to sort out, for instance, coins with values of 100-yen, 50-yen, 10-yen, and 5-yen, and 1-yen.

The count system, as shown in FIG. 9, comprises a total counter 7 and a detection signal arranging circuit 15.

The total counter 7 comprises register sections 13A, 13B, 13C, 13D and 13E provided respectively for 1-yen, 5-yen, 10-yen, 50-yen and 100-yen values. The register section 13A is a quinary register, the register section 13B is a binary register, the register section 13C is a quinary register, the register section 13D is a binary register, and the register section 13D is a decimal register.

Carry outputs of the register sections 13A, 13B, 13C and 13D are applied through OR circuits 14B, 14C, 14D and 14E to the register sections 13B, 13C, 13D and 13E, respectively. That is, a carry output of a first register section is applied through an OR circuit to a second register section which is provided for a denomination next higher than that for which the first register section is provided.

The detection signal arranging circuit 15 receives and stores detection pulse signals $S_1$, $S_2$, $S_3$, $S_4$ and $S_5$ respectively representing the detections of 1-yen, 5-yen, 10-yen, 50-yen and 100-yen coins. The detection pulse signals $S_1$ through $S_5$ thus stored are sequentially scanned, for instance in the order stated, with a predetermined timing. The detection pulse signals $S_1$ through $S_5$ thus scanned are applied, as detection pulse signals $P_1$, $P_2$, $P_3$, $P_4$ and $P_5$, to input terminals 15A, 15B, 15C, 15D and 15E of the register sections 13A through 13E, respectively.

The total counter 7 operates to apply the detection pulse signals $S_{1a}$ through $S_{50a}$ to register section 13B through 13E through the OR circuit 14B through 14D, respectively.

In the embodiment shown in FIG. 9, the detection pulse signals $P_1$ through $P_5$ are sequentially applied to the total counter 7 from the detection signal arranging circuit 15, as was described above. Therefore, even if the detection pulse signals $S_1$ through $S_5$ are applied to the detection signal arranging circuit 15, no error is caused in the summing of a total monetary value.

Furthermore, if the period of scanning the detection pulse signals $S_a$ through $S_b$ is selected so as to be much shorter than the intervals of pulse signals provided when coins pass through the coin detectors, a very simple memory circuit such as one-stage flip-flop circuits can be employed for storing the pulse signals $S_a$ through $S_e$. Accordingly, it can be said that the detection signal arranging circuit 15 is simple in construction when compared with the conventional one in which plural-stage flip-flop circuits are employed for storing the pulse signals.

In addition, since the detection pulse signals $S_a$ through $S_e$ are summed up whenever they are applied to the detection signal arranging circuit 15, even if a detection pulse signal is applied thereto with a delay, it can be positively added without the provision of a total instruction, which leads to the simplification of the count system and the shortening of the time for sorting out coins.

We claim:

1. A count signal arranging circuit for a control system for rearranging detection signals from a plurality of coin detectors into count signals with predetermined timing so that said counting signals can be totalized by a count addition circuit said count signal arranging circuit comprising:
   a. a clock signal generator for generating clock signals;
   b. a sequential drive signal forming circuit coupled to said clock signal generator for forming sequential drive signals each made up of a set of clock signals generated by said clock signal generator, and for sequentially and cyclically producing the sequential drive signals respectively at different times for the respective coin detectors; and
   c. a count signal generating circuit for each coin detector coupled to said sequential drive signal forming circuit and said clock signal generator for forming, when a detection signal produced by said coin detector is applied thereto, a predetermined pulse signal from clock signals of the sequential drive signal, which pulse signal is a count signal for the corresoinding coin detector, each count signal generating circuit comprising: an input signal detection circuit for the corresponding coin detector, which, at the occurrence of a clock signal on the leading edge of the sequential drive signal, detects the presence or absence of a detection signal from the corresponding coin detector, and thereafter memorizes the presence or absence of the detection signal until the end of the sequential drive signal; and
   a count pulse generating circuit coupled to said input signal detection circuit for forming, at the occurrence of the clock signal on the trailing edge of the sequential drive signal, a predetermined pulse signal which is a count signal based on the memory content of said input signal detection circuit which has been stored therein.

* * * * *